(12) United States Patent
Melcher

(10) Patent No.: US 6,838,922 B2
(45) Date of Patent: Jan. 4, 2005

(54) CIRCUIT ARRANGEMENT FOR GENERATING NON-OVERLAPPING CLOCK PHASES

(75) Inventor: Gebhard Melcher, Weinitzen (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/789,959

(22) Filed: Feb. 27, 2004

(65) Prior Publication Data

US 2004/0207439 A1 Oct. 21, 2004

Related U.S. Application Data

(63) Continuation of application No. PCT/DE02/02926, filed on Aug. 8, 2002.

(30) Foreign Application Priority Data

Aug. 31, 2001 (DE) .......................................... 101 42 657

(51) Int. Cl.[7] .............................................. G06F 1/04
(52) U.S. Cl. ...................................... 327/291; 327/295
(58) Field of Search ......................... 327/239, 256–259, 327/291, 295–297, 113–122; 377/47, 48

(56) References Cited

U.S. PATENT DOCUMENTS 5,111,066 A    5/1992  Artieri et al.
5,389,831 A  * 2/1995  Eisenstadt .................... 327/161
6,163,194 A   12/2000  Truong et al.

FOREIGN PATENT DOCUMENTS

| EP | 0 053 014 A1 | 6/1982 |
|----|--------------|--------|
| EP | 0 418 419 A1 | 3/1991 |
| JP | 59-149417 A1 | 8/1984 |
| JP | 6-152347 A1  | 5/1994 |

* cited by examiner

Primary Examiner—Kenneth B. Wells
(74) Attorney, Agent, or Firm—Darby & Darby

(57) ABSTRACT

A circuit arrangement for generating non-overlapping clock phases including a first circuit, a second circuit, and a multiplexer. The first circuit combines two input signals to form an output signal, and a first input provides for application of a common clock signal. The second circuit combines two input signals to form an output signal, and a first input provides for application of the common clock signal. The multiplexer has a first input connected to an output of the first circuit, a second input connected to an output of the second circuit, and an output connected to a second input of each of the first and second circuits, and has a third input that switches between the first and second inputs of the multiplexer for application of the clock signal. A plurality of non-overlapping clock phases are provided by output signals of the first and second circuits and of the multiplexer.

6 Claims, 5 Drawing Sheets

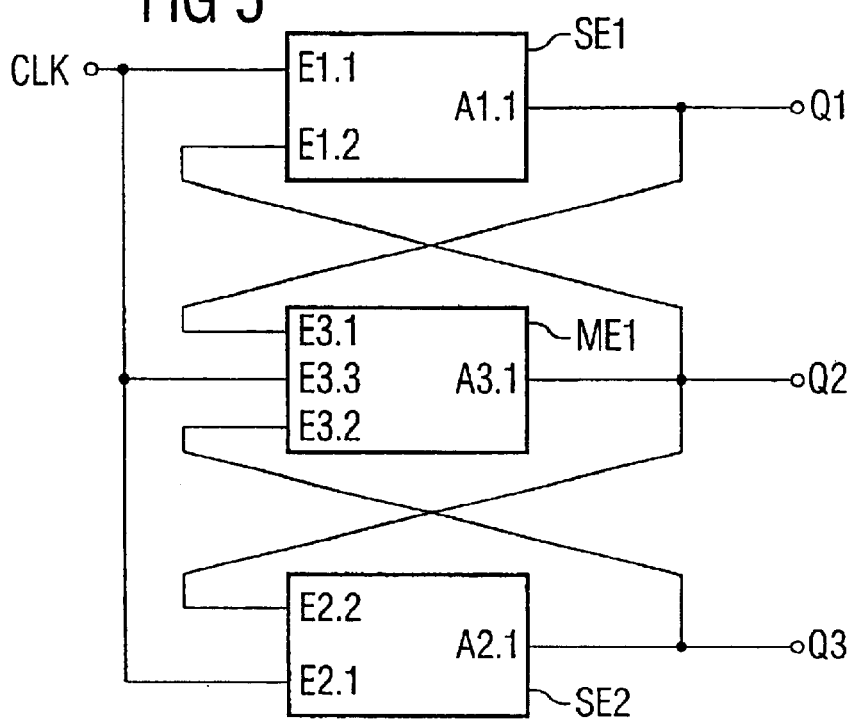
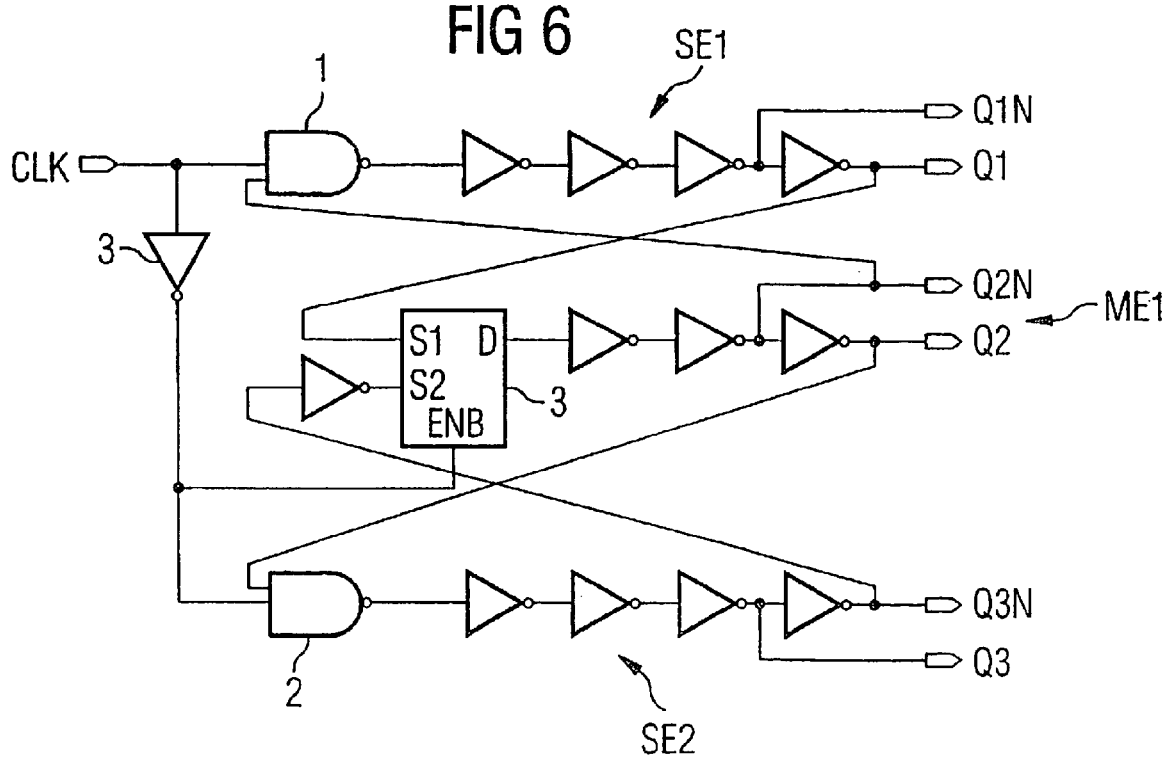

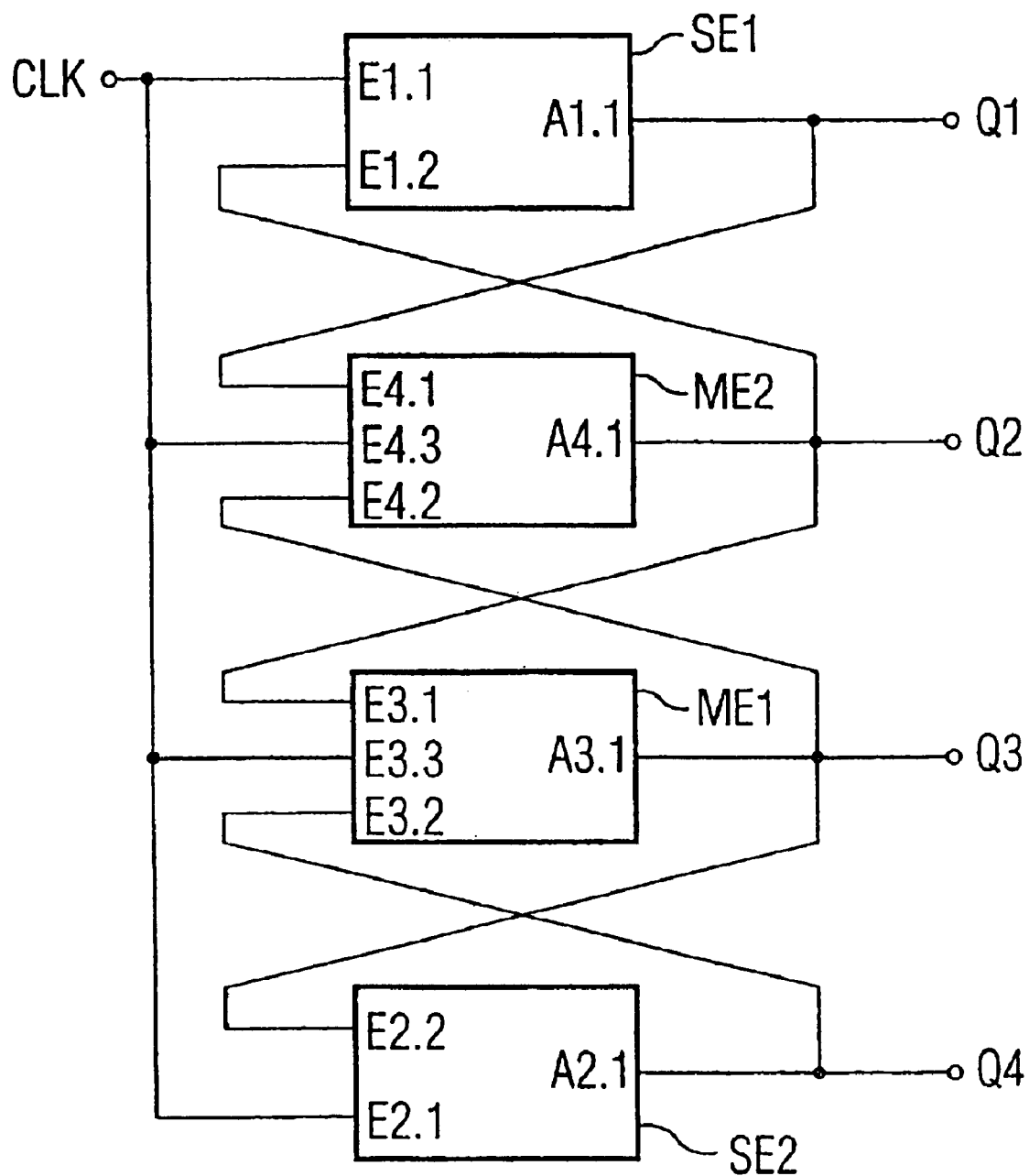

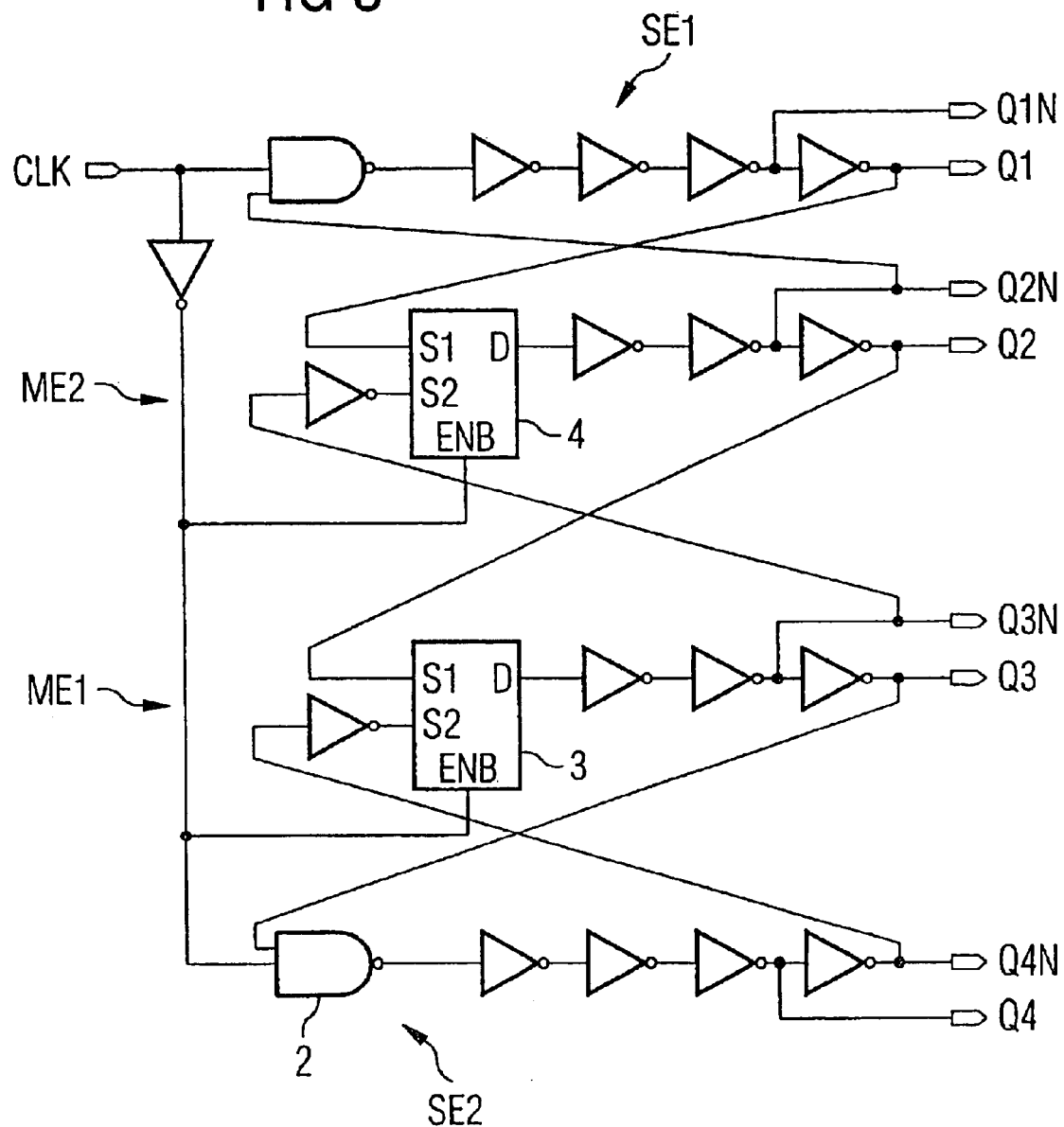

CIRCUIT ARRANGEMENT FOR GENERATING NON-OVERLAPPING CLOCK PHASES

CROSS-REFERENCE TO RELATED APPLICATION

This application is a continuation of International Patent Application Serial No. PCT/DE02/02926, filed Aug. 8, 2002, which published in German on Apr. 3, 2003 as WO 03/028216 A1, and which is incorporated herein by reference in its entirety.

FIELD OF THE INVENTION

The present invention relates to a circuit arrangement for generating non-overlapping clock phases.

BACKGROUND OF THE INVENTION

Multiphase clocks with guaranteed non-overlapping clock pulses are required for numerous applications. Examples of such applications are switched-capacitor filters, sigma-delta modulators, clock boosters or charge pumps. Circuits for generating two non-overlapping phases or clock phase pairs have been known for a long time from the prior art.

In individual cases, however, it is necessary to generate three or more clock phases which are interleaved in one another and have a defined position with respect to one another, this also ensuring a selection of a plurality of non-overlapping clock phases.

Varying load conditions constitute a particular problem in the generation of non-overlapping clock phases. Through capacitive loads, in particular, clock phases which do not actually overlap others are shifted in such a way that an overlap nonetheless occurs. A circuit from the prior art for two clock phases is illustrated in FIGS. 1 and 2, the resulting clock phases being illustrated in FIG. 3. The circuit arrangement illustrated in FIG. 1 essentially comprises two NAND elements, the output of which is in each case fed back to an input of the other NAND element.

A clock signal CLKIN is present both at the first NAND element 1 and, via an inverter, at the second NAND element 2. In order to explain the function, it is initially assumed that the second input of the NAND element 1 is at LOW. As long as the clock signal CLKIN remains at low, the output Q2 is HIGH. That input of the second NAND element 2 to which the inverted clock signal is applied is at HIGH at this point in time. The output Q2 is fed back to the second input of the second NAND element 2, as a result of which, at this point in time, a HIGH signal is likewise present there, the output of the second NAND element 2 thus goes to LOW and the output signal Q1 is likewise LOW.

When the clock signal CLKIN then changes to HIGH, the rising edge propagates in the circuit. The first input of the first NAND element thus receives a HIGH signal, so that a HIGH level and a LOW level are present at the inputs. The level at the output thus does not change and the edge cannot continue through the first NAND element 1.

The first input of the second NAND element 2 now receives a LOW signal, however, as a result of which the output jumps from LOW to HIGH and the edge continues. The output Q1, which is now HIGH, is fed back to the second input of the first NAND element 1, as a result of which two HIGH signals are present at the inputs of the first NAND element and, consequently, the output goes to low. Consequently, the edge has now also propagated to the second output Q2. This state is maintained until the level of the clock signal CLKIN changes again.

A falling clock edge continues in the manner described with reference to the rising edge. However, initially only the output signal of the first NAND element 1 changes, while despite different occupancy of the inputs, the output signal of the second NAND element 2 remains the same. Therefore, the level of the output Q2 is the first to change, followed by the level of the output Q1. The signals at the outputs Q1 and and Q2 are thus interleaved in one another. The time interval between state changes at the outputs Q1 and Q2 is determined by the magnitude of the delay times of the logic switching elements, that is to say of the NAND elements in FIG. 1.

The delay times can be precisely defined through the targeted use of additional delay elements.

Such a circuit is shown in FIG. 2. In addition to the NAND elements 1 and 2, a plurality of inverters are connected between the outputs of the NAND elements 1 and 2 and the circuit outputs Q1 and Q2, each inverter having a typical switching time which leads to a delay of the signal. In addition, two further outputs Q1N and Q2N are past out, said further outputs respectively carrying the complementary signal with respect to Q1 and Q2.

The signals generated by such a circuit arrangement are illustrated in FIG. 3. The phases Q1 and Q2 are strictly non-overlapping (positive logic), while the phases Q1N and Q2N are strictly overlapping (positive logic) or likewise non-overlapping (negative logic). The clock gap or non-overlapping time is designated by Tnovl. This clock system with two non-overlapping clock phases is suitable for driving switched-capacitor filters or charge pumps, for example.

SUMMARY OF THE INVENTION

It happens, however, that certain circuit blocks require a third clock phase pair which is not simply temporally offset with respect to an existing phase pair, but rather switches in non-overlapping fashion in a temporally interleaved manner. FIG. 4 represents a timing diagram which illustrates this requirement. Through a suitable combination of signals, for any arbitrary requirement with regard to the overlaps, it should always be possible to find three signals which satisfy these requirements. For three or more non-overlapping clock phases, it has been necessary hitherto to use system clock frequencies which are higher by a multiple and to subdivide the frequency periods. However, the high frequency of the system clock leads to considerable complexity in terms of circuitry.

Therefore, it is an object of the invention to specify a circuit arrangement by means of which three or more non-overlapping clock phases can be generated. In this case, the intention is to ensure that the temporal offset between the clock phases is complied with independently of a connected load.

This object is achieved by means of a circuit arrangement for generating non-overlapping clock phases having a first circuit unit for combining two input signals to form an output signal and a second circuit unit for combining two input signals to form an output signal, a respective first input of the first and second circuit units being provided for the application of a common clock signal, and a first multiplexer unit, a first input being connected to an output of the first circuit unit, a second input being connected to an output of the second circuit unit and the output of the multiplexer unit being connected to in each case a second input of the first and second circuit units and provision being made of a third input for changing over between the inputs of the first multiplexer unit for application of the clock signal, a plurality of non-overlapping clock phases being provided by output signals of the first and second circuit units and of the first multiplexer unit.

What is achieved by the insertion of the multiplexer unit and the corresponding linking to the two circuit units is that the circuit arrangement known from FIGS. 1 and 2 becomes scalable. A further output is added to the two outputs present in the prior art. It is advantageous that only standard logic gates are used. What is achieved by the feedback arrangement is that an overlap is avoided under all circumstances up to the limit of the maximum possible frequency. This also applies, in particular, to changing capacitive loads. In this case, only a single reference clock is required, the frequency of which is equal to that of the output signal.

It is particularly advantageous that the invention's insertion of a multiplexer unit can be employed multiply, so that, through the insertion of further multiplexer units, correspondingly more output signals are also available which are in each case interleaved in non-overlapping fashion.

The circuit is constructed particularly simply if the first and second circuit units are in each case a NAND element having delay elements connected downstream, said delay elements in each case comprising series-connected inverters.

The invention is explained in more detail below with reference to an exemplary embodiment.

BRIEF DESCRIPTION OF THE DRAWINGS

FIG. 5 shows a first exemplary embodiment of a circuit arrangement according to the invention;

FIG. 6 shows a detailed illustration of the circuit arrangement of FIG. 5; and

FIG. 7 shows a second exemplary embodiment of a circuit arrangement according to the invention; and FIG. 8 shows a detailed illustration of the exemplary embodiment of FIG. 7.

DETAILED DESCRIPTION OF THE PREFERRED MODE OF THE INVENTION

Figure 1:
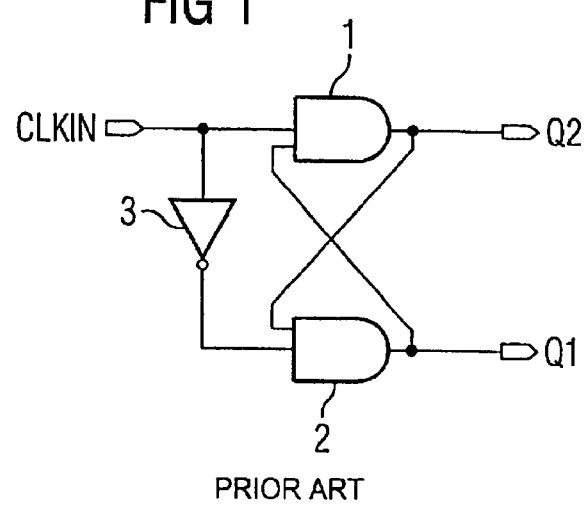
FIGS. 1 and 2 show the already described circuit arrangements from the prior art.
Figure 2:
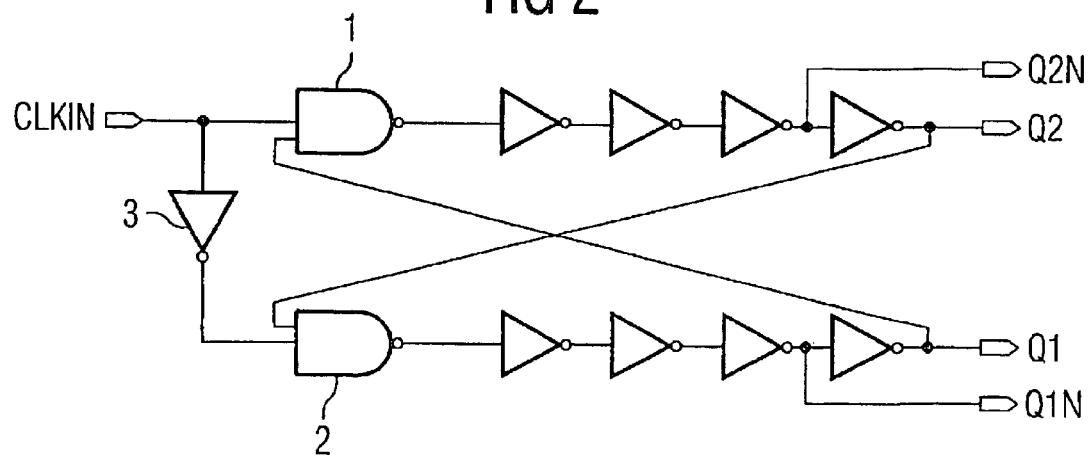
Figure 3:
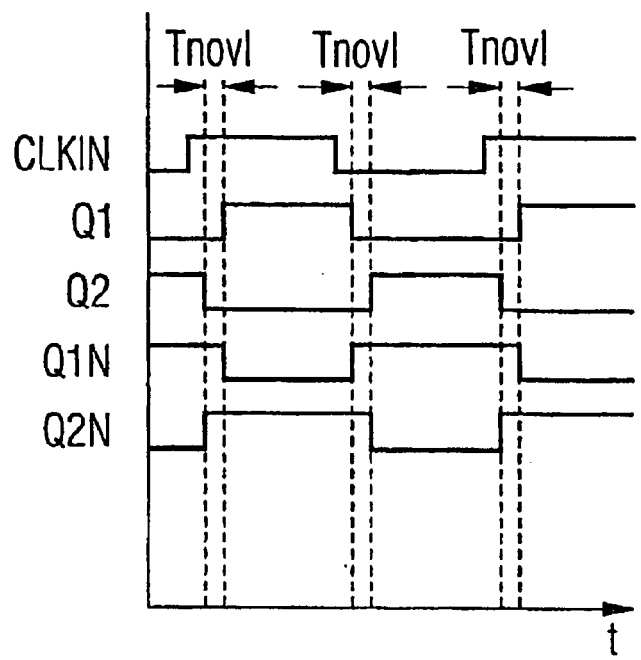
FIG. 3 shows a timing diagram for a circuit according to the prior art in accordance with FIG. 2.
Figure 4:
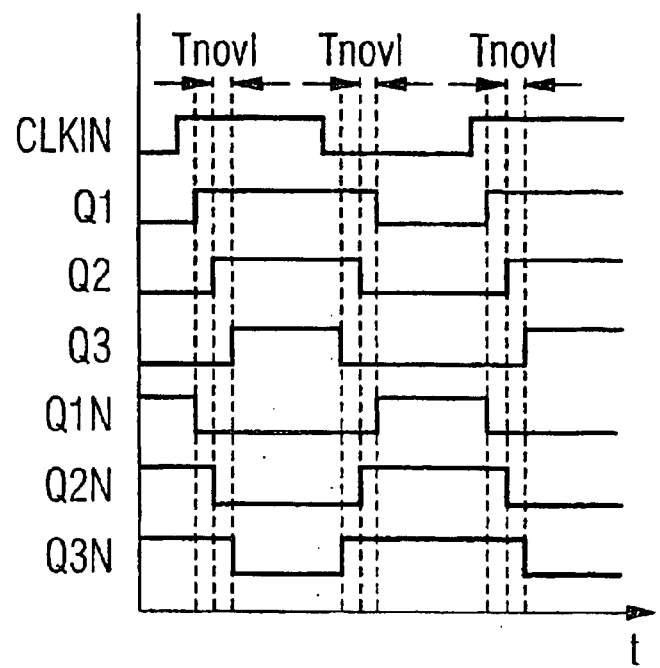
FIG. 4 shows a timing diagram which can be generated by a circuit arrangement according to the invention.

FIGS. 1 to 3 show circuit arrangements from the prior art and the corresponding timing diagram, as already described in the introduction to the description. FIG. 4 shows a timing diagram such as can be generated by circuit arrangements according to the invention.

Such a circuit is illustrated in FIG. 5. A clock signal CLK is past to first inputs E1.1 and E2.1 of a first switching unit SE1 and of a second switching unit SE2. Moreover, a multiplexer unit ME1 is provided, the third input of which is provided for application of the clock signal CLK. The third input E3.3 of the multiplexer unit is provided for changing over between a first and a second input M3.1 and M3.2 of the multiplexer unit. The output A1.1 of the first switching unit SE1 is connected to the first input E3.1 of the multiplexer unit ME1. The output A2.1 of the second switching unit SE2 is correspondingly connected to the second input E3.2 of the multiplexer unit. Furthermore, the output A3.1 of the first multiplexer unit ME1 is connected both to the second input E1.2 of the first switching unit SE1 and to the second input E2.2 of the second switching unit SE2. The outputs A1.1, A2.1 and A3.1 of the first and second switching units SE1 and SE2 and of the multiplexer unit ME1 are provided as outputs Q1, Q2 and Q3 for tapping off an output signal.

Various embodiments are conceivable for the first and second switching units SE1 and SE2. One possible embodiment is illustrated in FIG. 6, where the switching units SE1 and SE2 comprise a respective NAND element 1 and 2, and also inverters connected downstream as delay elements. The multiplexer unit ME1 comprises a multiplexer 3, inverters as delay element likewise being connected downstream of the output of said multiplexer.

A positive signal edge firstly passes through the switching unit SE1, so that the output Q1 is the first to go to HIGH (cf. FIG. 4). The ENB input of the multiplexer 3 is connected to the inverted clock signal CLK. As a result, firstly the input S1 of the multiplexer 3 is activated. The positive clock edge therefore continues, coming from Q1, through the multiplexer 3 to the output Q2. As in the case of a circuit according to the prior art, the signal at the output Q2 is fed back to the NAND element 2 and continues from the output thereof through the inverters used as delay element to the output Q3, so that the output Q3 is the last to go to HIGH. The outputs remain in the state now assumed until the clock signal CLK changes.

In the event of a falling clock edge, that is to say when the clock signal CLK goes to LOW, the multiplexer 3 is changed over, so that now the input S2 of the multiplexer 3 is activated. The negative edge cannot continue through the NAND element 1 since the second input of the NAND element would additionally have to go to LOW, which takes place only when the output Q2 has changed its state. However, the negative clock edge can propagate through the NAND element 2. Therefore, first the output Q3 goes to LOW. The multiplexer 3, which has changed over to the input S2 in the meantime, now permits the falling clock edge to continue through the multiplexer 3 and the delay elements connected downstream to the output Q2. From there, the falling edge continues to the input of the NAND element 1 in order to arrive at the output Q1 after passing through the delay elements, so that said output Q1 also goes to low. As soon as the clock signal goes to HIGH again, the multiplexer 3 is once again changed over and the operation starts anew.

FIG. 7 illustrates a further exemplary embodiment of a circuit arrangement according to the invention, by means of which four mutually interleaved and non-overlapping clock phases are intended to be generated. In order to realize this object, a further multiplexer unit ME2 is connected between the first switching unit SE1 and the first multiplexer unit ME1. The output of the first switching unit SE1 is now no longer connected to a first input of the first multiplexer unit ME1, but rather to a first input of the second multiplexer unit ME2. The multiplexer unit ME2 is now likewise connected into the feedback of the output of the first multiplexer unit ME1 to the second input of the first switching unit 1. The method of operation is analogous to the method of operation described with reference to FIG. 5. The second multiplexer unit ME2 also has a delay element, so that an intended defined time delay is present between the output signal at Q2 and the output signal at Q3.

The circuit arrangement illustrated as a block diagram in FIG. 7 is shown again in more detail in FIG. 8. This reveals that the second multiplexer unit ME2 is constructed identically to the first multiplexer unit ME1. In other words, it has a multiplexer 4 and delay elements connected downstream.

In the detailed illustrations of FIG. 6 and FIG. 8, the switching units SE1 and SE2 are in each case realized with a NAND element and delay elements connected downstream. Equally suitable, however, is a realization with other logic gates, for example with NOR elements. If the two NAND elements 1 and 2 are replaced by NOR elements in the circuit arrangement of FIG. 6, the functionality of the circuit is preserved and all that changes is the assignment of desired output signals to the outputs of the circuit. In the present case of FIG. 6, the terminals Q1 and Q3, and respectively Q1N and Q3N, would be interchanged.

In FIGS. 6 and 8, the multiplexers 3 and 4 are illustrated as multiplexer modules. It is at the discretion of a person skilled in the art to realize the function of a multiplexer by means of a discrete construction.

Circuit arrangements for five and more clock phases can be constructed analogously by the addition of further multiplexer units which are to be connected between a switching unit SE1 or SE2 and an adjoining multiplexer unit.

In order to obtain practically utilizable external signals, it is merely necessary to coordinate the delay times with the desired clock frequency. Corresponding dimensionings lie within the scope of expert ability.

What is claimed is:

1. A circuit arrangement for generating non-overlapping clock phases, comprising:

a first circuit unit combining two input signals to form an output signal, a first input of the first circuit unit provided for application of a common clock signal;

a second circuit unit combining two input signals to form an output signal, a first input of the second circuit unit provided for application of the common clock signal; and a first multiplexer unit having a first input connected to an output of the first circuit unit, a second input connected to an output of the second circuit unit, and an output connected to a second input of each of the first and second circuit units, and having a third input that switches between the first and second inputs of the first multiplexer unit for application of the clock signal, wherein a plurality of non-overlapping clock phases are provided by output signals of the first and second units and of the first multiplexer unit.

2. The circuit arrangement as claimed in claim 1, further comprising a second multiplexer unit connected between the first circuit unit and the first multiplexer unit, wherein a first input of the second multiplexer unit is connected to the output of the first circuit unit, a second input of the second multiplexer unit is connected to the output of the first multiplexer unit, and an output of the second multiplexer unit is connected to the first input of the first multiplexer unit and the second input of the first switching unit, and a third input of the second multiplexer unit is provided for application of the clock signal.

3. The circuit arrangement as claimed in claim 2, further comprising additional multiplexer units connected between the first circuit unit and the multiplexer unit nearest thereto, wherein each of the additional multiplexer units is connected in a manner similar to that of the second multiplexer unit between the first circuit unit and the first multiplexer unit.

4. The circuit arrangement as claimed in claim 1, wherein each of the first and second circuit units includes a NAND element with a delay element coupled downstream from the NAND element, and wherein an inverter is coupled upstream of the first input of the second circuit unit.

5. The circuit arrangement as claimed in claim 1, wherein each of the first and second circuit units includes a NOR element with a delay element coupled downstream from the NOR element, and wherein an inverter is coupled upstream of the first input of the second circuit unit.

6. The circuit arrangement as claimed in one of claim 1, wherein the first multiplexer unit includes a multiplexer and a delay element connected downstream from the multiplexer, and wherein the first and second inputs of the first multiplexer unit are data inputs of the multiplexer and the third input of the multiplexer unit is the switch input of the multiplexer.

\* \* \* \* \*